(12) United States Patent
Taussig et al.

(10) Patent No.: US 6,567,295 B2
(45) Date of Patent: *May 20, 2003

(54) ADDRESSING AND SENSING A CROSS-POINT DIODE MEMORY ARRAY

(75) Inventors: Carl Taussig, Redwood, CA (US); Richard Elder, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/875,496

(22) Filed: Jun. 5, 2001

(65) Prior Publication Data

US 2002/0191434 A1 Dec. 19, 2002

(51) Int. Cl.[7] .............................................. G11C 17/06
(52) U.S. Cl. .......................... 365/105; 365/175; 365/243
(58) Field of Search .............................. 365/105, 175, 365/243, 225.7

(56) References Cited

U.S. PATENT DOCUMENTS

| | | | |
|---|---|---|---|
| 3,626,389 A | * 12/1971 | Waaben | 365/175 |
| 5,483,482 A | * 1/1996 | Yamada et al. | 365/175 |
| 6,285,582 B1 | * 9/2001 | Lin | 365/175 |
| 6,385,075 B1 | * 5/2002 | Taussig et al. | 365/105 |

* cited by examiner

*Primary Examiner*—Trong Phan (57) ABSTRACT

A memory circuit includes a cross-point memory array having first and second sets of transverse electrodes with respective memory elements formed at the crossing-points of the first and second set electrodes. Each of the memory elements is formed to include, in at least one of its binary states, a diode element. The memory circuit also includes an addressing circuit coupled to the memory array. The addressing circuit has a first set of address lines with first diode connections between the first set address lines and the first set memory array electrodes, with the first diode connections coupling each memory array electrode in the first set to a respective unique subset of the first set address lines. The addressing circuit also has a second set of address lines with second diode connections between the second set address lines and the second set memory array electrodes, with the second diode connections coupling each memory array electrode in the second set to a respective unique subset of the second set address lines. The first and second diode connections form a permuted diode logic circuit whereby application of predetermined voltages to selected subsets of the first and second address lines enables unique addressing of a single memory element in the array. By sensing the current in the address lines the binary state of the addressed memory element may be determined. Also, by application of a writing voltage to the selected subsets of address lines, the binary state of a memory element can be changed by substantially and permanently changing the resistance thereof.

19 Claims, 8 Drawing Sheets

ADDRESSING AND SENSING A CROSS-POINT DIODE MEMORY ARRAY

FIELD OF THE INVENTION

The present invention relates to the field of digital memory circuits, and in particular to addressing and sensing memory elements in a cross-point diode memory array.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (preferably less than 1 ms) and moderate transfer rate (e.g. 20 Mb/s). Preferably, also, the storage memory should be able to be packaged in an industry standard interface module, such as Personal Computer Memory Card International Association ("PCMCIA") or Compact Flash ("CF") card.

One form of storage currently used for application in portable devices such as digital cameras is Flash memory. This meets the desired mechanical robustness, power consumption, transfer, and access rate characteristics mentioned above. However, a major disadvantage is that Flash memory remains relatively expensive ($1.50-$2 per MB). Because of the price it is generally unreasonable to use Flash memory storage as an archive device, thus requiring data to be transferred from it to a secondary archival storage.

Magnetic "hard disc" storage can be used for archival storage, even in portable devices. Miniature hard disc drives are available for the PCMCIA type III form factor, offering capacities of up to 1 GB. However, such disc drives are still relatively expensive ($0.5 per MB), at least partially because of the relatively high fixed cost of the disc controller electronics. Miniature hard drives have other disadvantages when compared to Flash memory, such as lower mechanical robustness, higher power consumption (~2 to 4W), and relatively long access times (~10 mS).

Removable optical storage discs can similarly be used, which offer one large advantage compared to hard disc. The removable optical media is very inexpensive, for example of the order of $0.03 per MB for Minidisc media. However in most other respects optical disc storage compares poorly with magnetic hard discs including relatively poor power consumption, mechanical robustness, bulk, and access performance.

Another form of archival storage is described in co-pending U.S. patent application Ser. No. 09/857,356, entitled "Non-Volatile Memory", the disclosure of which is hereby incorporated herein by reference. The memory system disclosed therein aims to provide high capacity write-once memory at low cost for archival storage. This is realized in part by avoiding silicon substrates, minimizing process complexity and lowering areal density. The memory system includes a memory module formed of a laminated stack of integrated circuit layers constructed on plastic substrates. Each layer contains cross-point diode memory array, and sensing of the data stored in the array is carried out from a separate integrated circuit remotely from the memory module. In order to address, read from and write to all of the memory elements in the arrays of the various memory module layers, a multiplexing scheme is required to avoid having too many interconnections between the memory module and the remote sensing circuitry.

In conventional integrated circuits multiplexing is accomplished by logic gates synthesized from transistors. It is undesirable to include transistors in a diode based cross-point memory array because they will add to the required processing thereby increasing the fabrication cost. Some of the additional processing may be incompatible with other materials used in the cross-point array. If plastic substrates or organic semiconductors are used to form the cross-point memory array, for example, they may be destroyed by temperatures required for transistor fabrication, or they could be damaged by certain solvents used in a wet etching process. Recently, researchers at Lawrence Livermore Laboratories have demonstrated the fabrication of thin-film-transistors on a plastic substrate, however the process required is much more complicated, and hence more expensive, than the equivalent process required to fabricate diodes.

Electrostatic micro-relays have been developed for a number of applications including power relays for automotive application, and small signal switching for instrumentation and automatic test equipment. Electrostatic micro-relay systems are described, for example, in Wong, Jo-Ey, et al., "An Electrostatically-actuated MEMS Switch for Power Applications", (Micro Electro-Mechanical Systems, 2000. MEMS '00. Thirteenth IEEE. 2000), and Zavracky, P. M., et. al., "Micro-mechanical switches fabricated using nickel surface micro-machining", (Micro-electromechanical Systems, Journal of, 1997.6(1): p3–9). The principle advantages of this technology are low power consumption and simplicity of construction. The processing for these devices is still more significant than that required for a simple diode array, however, particularly if a low contact resistance is required.

A third possibility, code-word addressing, includes a number of approaches which have been used to minimize the interconnections to a pixelated display. Such systems are described, for example, in the specification of International Patent Application Publication WO 98/44481, and U.S. Pat. No. 5,034,736. In general code word addressing trades off the ratio of addressing lines to array electrodes and the cross-talk between selected and de-selected electrodes. Although these solutions do not offer log-base-2 reduction in interconnect, they may offer better than 10:1 ratio of electrode to address line, while maintaining a 4:1 cross-talk ratio. Although these solutions are relatively simple to implement, they require a higher number of address lines for a given number of addressed lines than the true multiplexing schemes described previously. A further disadvantage is the cross-talk introduced between addressed and non-addressed memory elements, which makes it difficult to read and write a particular memory element.

SUMMARY OF THE INVENTION

In accordance with the principles of the present invention, there is provided an addressing circuit for addressing a cross-point memory array having first and second sets of electrodes arranged so that each electrode in the first set crosses over each electrode in the second set and a respective memory element is formed at each crossing point of the electrodes from the first and second sets. The addressing circuit includes a first set of address lines and a plurality of first diode elements coupled between the first set address lines and the first set electrodes. Each of said first set electrodes are coupled by said first diode elements to a respective unique subset of the first set address lines. The addressing circuit also includes a second set of address lines and a plurality of second diode elements coupled between the second set address lines and the second set electrodes, wherein each of said second set electrodes are coupled by said second diode elements to a respective unique subset of the second set address lines.

Preferably, the addressing circuit includes an address application circuit adapted to apply predetermined voltages to selected subsets of the first and second set address lines, and a sensing circuit coupled to the first and second set address lines for sensing an electrical current in the address lines resulting from said applied voltages to thereby determine a binary state of an addressed memory element in the memory array based on the sensed electrical current.

The addressing circuit preferably also includes a memory writing circuit coupled to the first and second sets of address lines and the first and second set electrodes, the memory writing circuit being adapted to apply predetermined write voltages to the first and second sets of electrodes and a selection voltage to selected subsets of the first and second set address lines, the predetermined write voltage being sufficient to effect a permanent and substantial change in resistance of an addressed memory element in the array determined by the selected subsets.

In a preferred form of the addressing circuit the first diode elements have anodes coupled to the respective first set memory array electrodes and cathodes coupled to the respective first set address lines, and the second diode elements have cathodes coupled to the respective second set memory array electrodes and anodes coupled to the respective second set address lines.

Preferably the cross-point memory array comprises an array of diode based memory elements formed at cross-points of electrodes from the first and second sets, with ends of the electrodes coupled to power supply connections through respective resistive elements. The power supply connections can then be arranged in power supply striping groups to enable power to be selectively supplied to portions of the cross-point array.

In accordance with the present invention, there is also provided a memory circuit including a cross-point memory array having first and second sets of transverse electrodes with respective memory elements formed at the crossing-points of the first and second set electrodes, each memory element including, in at least one of its binary states, a diode element. The memory circuit includes an addressing circuit having a first set of address lines with first diode connections between the first set address lines and the first set memory array electrodes, wherein the first diode connections couple each memory array electrode in the first set to a respective unique subset of the first set address lines. A second set of address lines are provided with second diode connections between the second set address lines and the second set memory array electrodes, the second diode connections coupling each memory array electrode in the second set to a respective unique subset of the second set address lines. The memory circuit also has a read/write circuit adapted to apply predetermined voltages to selected subsets of the first and second set address lines, and including a sensing circuit coupled to the first and second set address lines for sensing an electrical current in the address lines resulting from the applied voltages to thereby determine a binary state of an addressed memory element in the array based on the sensed electrical current.

The read/write circuit may further include a memory writing circuit coupled to the first and second sets of address lines and the first and second set electrodes, the memory writing circuit being adapted to apply predetermined write voltages to the first and second sets of electrodes and a selection voltage to selected subsets of the first and second set address lines, the predetermined write voltage being sufficient to effect a permanent and substantial change in resistance of an addressed memory element in the array determined by the selected subsets.

An integrated circuit can be constructed including the memory circuit, wherein the memory array and addressing circuit are formed in the same fabrication process. In a preferred form of the invention, the integrated circuit is formed on a dielectric substrate surface.

In accordance with the present invention, there is also provided a method for reading data from, or writing data to, a cross-point memory array having first and second sets of electrodes from first and second sets of address lines. The method includes forming first diode connections between the first set address lines and the first set memory array electrodes, wherein the first diode connections couple each memory array electrode in the first set to a respective unique subset of the first set address lines. Second diode connections are formed between the second set address lines and the second set memory array electrodes, the second diode connections coupling each memory array electrode in the second set to a respective unique subset of the second set address lines. In the case of reading data from the array, predetermined voltages are applied to selected subsets of the first and second set address lines, to enable sensing of an electrical current in the address lines resulting from the applied voltages to thereby determine a binary state of an addressed memory element in said array based on the sensed electrical current. In the case of writing data to the array, predetermined write voltages are applied to the memory array electrodes and selection voltages to selected subsets of the first and second set address lines, the predetermined write voltage being sufficient to effect a permanent and substantial change in resistance of an addressed memory element in said array. The addressed memory element is determined by the particular subsets of the first and second set address lines to which selection voltages are applied.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Write-once memory circuits, storage systems, addressing and sensing circuits and methods for producing, implementing and using such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, whilst on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

A preferred embodiment of the present invention comprises an addressing circuit and a method of addressing a cross-point diode memory array of the type utilized in the memory system described in the aforementioned co-pending US patent. In order to provide a thorough understanding of the invention, the following detailed description is therefore presented in the context of such a memory system, although those skilled in the art will recognize that the invention is not limited in application to the described structure.

A Write-Once Memory System

Figure 1:
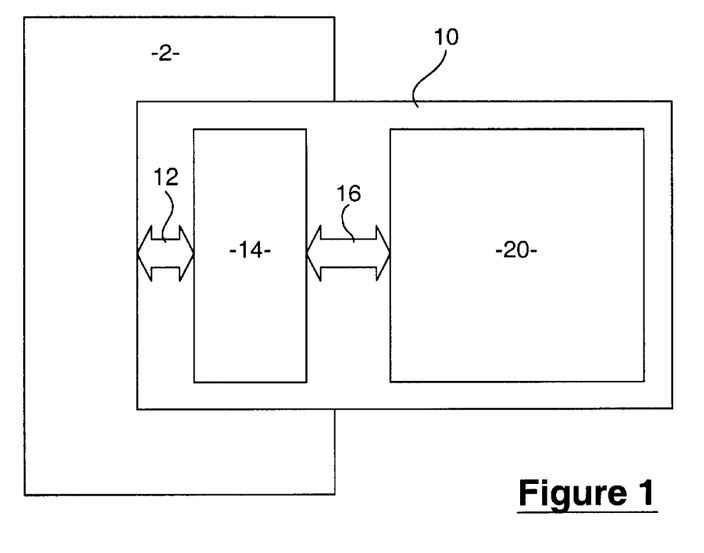
FIG. 1 is a block diagram of a write-once memory system according to an embodiment of the invention.

A portable, inexpensive, rugged memory system that is particularly useful for data storage in applications such as digital cameras and portable digital audio devices, amongst other things, is embodied by the memory card 10 illustrated in block diagram form in FIG. 1. The memory system may be incorporated into an industry standard portable interface card (e.g. PCMCIA or CF) so that it can be used in existing and future products with such interfaces. The memory card 10 has an I/O interface connector 12 through which communication is made between the card 10 and a device 2 to which it is coupled. The interface connector is coupled to an interface and control circuit 14 which is connected to a removable memory module 20. The memory module 20 provides circuitry for write-once data storage, including some detection, write enabling and addressing functions. The interface and control circuit 14 comprises circuitry for control, interface, detection, error correction coding (ECC) and the like for each removable memory module 20 when it is received in the card. The memory module 20 is received in a socket or the like in the memory card, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1"s, and not the other way around.

A Write-Once Memory Module

Figure 2:
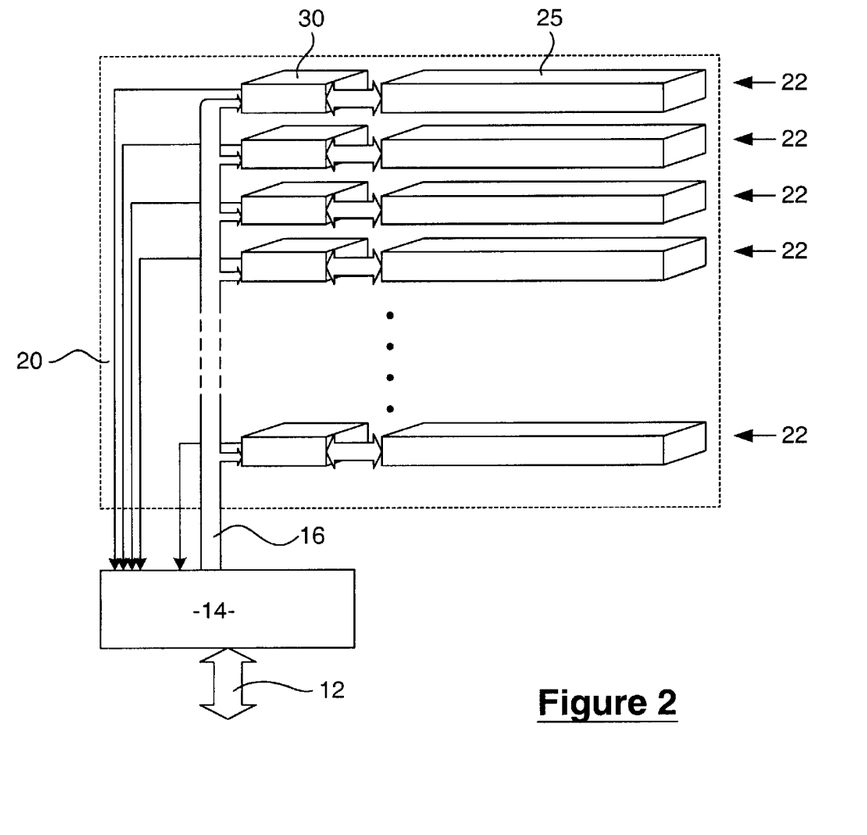
FIG. 2 is a schematic block diagram of the write-once memory system illustrating the general structure of a memory module thereof.

A diagrammatic block representation of a memory module 20 is shown in FIG. 2, coupled to an interface and control circuit 14. In order in increase storage capacity of the memory module for a given base area, the module 20 is constructed from a stack of laminated layers 22. Each layer 22 has an array 25 of memory elements that provide the data storage. The layers also each include addressing circuitry 30 coupling the respective memory arrays through the memory system internal interface 16 to the interface and control circuit 14. The addressing circuitry on each layer enables fewer interconnecting conductors between the layers of the memory module, which facilitates ease of fabrication and thus lowered costs.

Figure 3:
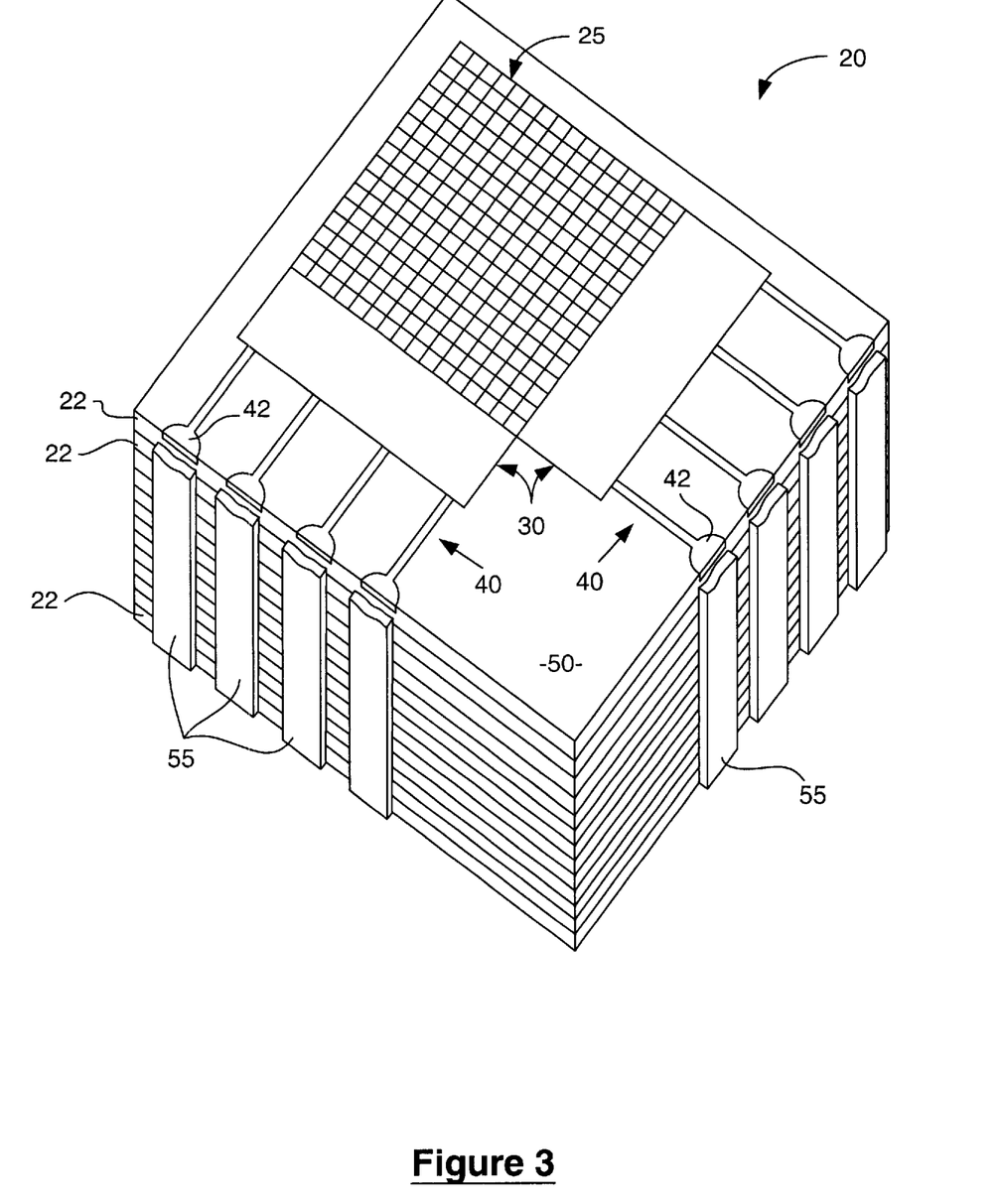
FIG. 3 is a cut-away isometric view of a write-once memory module constructed in accordance with an embodiment of the invention.

FIG. 3 is a cut-away isometric view of a memory module 20, illustrating a possible physical arrangement of circuits and layers in the memory module. Each of the layers 22 comprises a memory array 25 and addressing circuits 30 formed on a substrate 50. The memory array 25 comprises a matrix of memory elements 26. The addressing circuits 30 comprise column and row multiplexing circuit portions that are positioned adjacent respective orthogonal edges of the memory array 25. Input/output (I/O) leads 40 are also formed on the substrate during the fabrication process. In the memory module 20, row I/O leads extend from the row multiplexing circuit to a first adjacent edge of the substrate, and column I/O leads extend from the column multiplexing circuit to a second adjacent edge of the substrate. Each of the leads 40 terminate at respective contact pads 42, portions of which are exposed at the edges of the substrate 50.

A plurality of layers 22 are stacked in the same orientation and laminated together. Electrical contact is made to the exposed portions of the contact pads 42 of the stacked layers by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module 20 through the memory system internal interface 16 to the interface and control circuit 14.

In the preferred implementation of the memory module the substrate 50 for each of the layers 22 is formed from a polymer plastics material. The processes by which the integrated circuits (e.g. memory array and addressing circuitry) can be formed on the substrate, and the layers assembled into a memory module are described in detail in the specification of the aforementioned co-pending US patent application.

A Write-Once Memory Array

Figure 4:
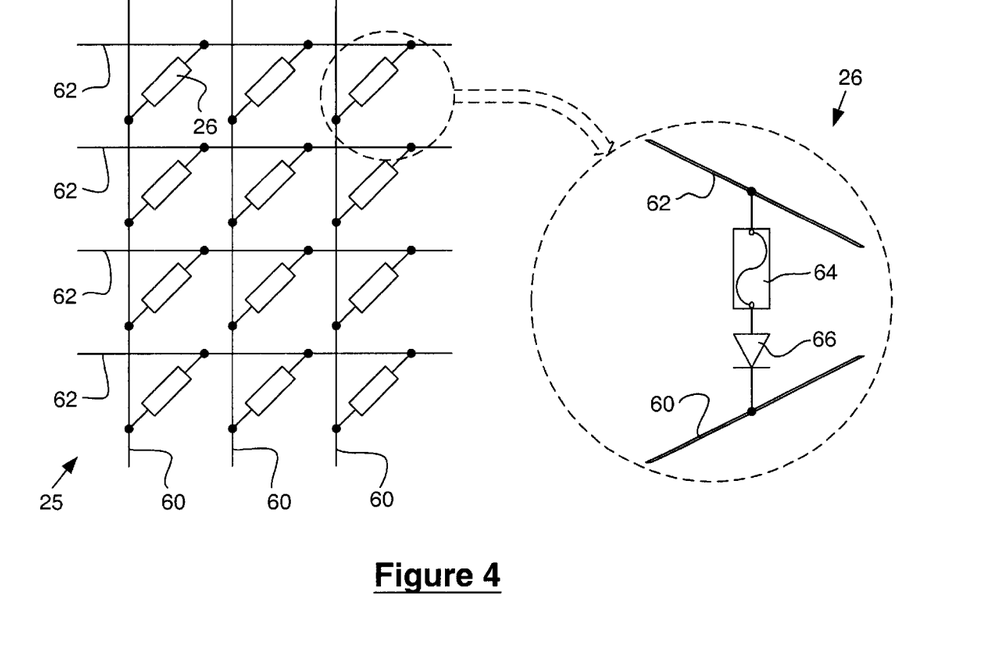
FIG. 4 is a pictorial diagram of a cross-point memory element suitable for implementation in embodiments of the invention.

An array 25 of memory elements 26 is formed on each of the layers in the memory module 20. The memory array comprises a regular matrix of column lines and row lines with a memory element at each column/row intersection. FIG. 4 illustrates a schematic diagram of a portion of a memory array 25 having column lines 60 and row lines 62. Coupled between each of the column lines and row lines is a memory element 26, which is also shown in greater detail in an expanded portion of the diagram in FIG. 4. In the preferred implementation of the memory array, each memory element 26 schematically comprises a fuse element 64 coupled in series with a diode element 66. The fuse element 64 provides the actual data storage effect of the memory element, whilst the diode 66 facilitates addressing of the memory element using the row and column lines for writing and reading data.

The preferred operation of the memory array 25 is as follows. At fabrication, each of the memory elements 26 has a fuse element 64 that is conductive. The conductive state of the fuse element represents one binary data state, say a data "0". In order to write data to the memory array, each memory element in which it is desired to store a data "1" is addressed using the column and row lines and the fuse element therein is "blown", placing it in a non-conductive state. The non-conductive state of the fuse element represents the other binary data state, say a data "1". Blowing the fuse element is, in most cases, a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/column lines. Data can be read from the memory array by addressing memory elements using the column and row lines and sensing which memory elements are conductive (data "0"s) and which are non-conductive (data "1"s). More generally, the binary data states of memory elements are distinguished by some ratio between "conductive" resistance and "non-conductive" resistance.

It will be appreciated that, although the above description refers to fuse elements in the memory array that are fabricated in a low resistance state and blown to create a high resistance state, it is equally possible to create a memory array using "anti-fuse" elements that operate in the opposite manner. In that case, the memory elements are fabricated in a high resistance state, and blown to create a low resistance. The anti-fuse in each memory element is also formed in series with a diode for the reasons mentioned above. The diode and anti-fuse are separate in this case, since the diode function is required after the anti-fuse has been blown.

A mandatory characteristic for the fuse or anti-fuse element is that its resistance change between a high state and a low state irreversibly or the reverse at some critical current threshold. The change in resistance must be substantial: several orders of magnitude. The critical current of the fuses should also be controllable by the area of the devices. The area of the device may simply be determined by the area of intersection of the row and column electrodes or may be lithographically defined. The fuse and diode elements can be formed from a number of thin films deposited in series between the row and column electrodes. The individual memory elements occur at the intersection of the row and column electrodes. Although the fuse and diode layers are deposited as contiguous films covering the entire area, they may be patterned by a number of means (laser ablation, photolithography, soft lithography) to minimize cross talk between individual devices.

The diode element 66 in each memory element 26 of the array assists in addressing the memory elements uniquely using the column and row lines for writing and reading data. Without a diode in the row/column cross-point memory elements there are current paths through many memory elements between a given column line and row line. However, with the diodes element forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1". Also, by sensing the resistance in the circuit it is possible to determine whether the memory element fuse is blown or intact, thereby reading a data "1" or data "0".

Thus, the diodes 66 eliminate cross-talk between the memory elements in the memory array during reading and writing operations. Furthermore, the non-linear current-voltage (I-V) characteristics of the diodes improves the data sensing signal-to-noise ratio (SNR), which assists in remote sensing and addressing. The data in the memory module is sensed remotely since the sensing circuitry is in the interface and control circuit 14, which is contained in a separate integrated circuit. Also, permuted diode logic is employed for addressing of the memory elements as described hereinbelow, in order to reduce the number of connections required between the memory module 20 and the interface and control circuit 14.

Figure 5:
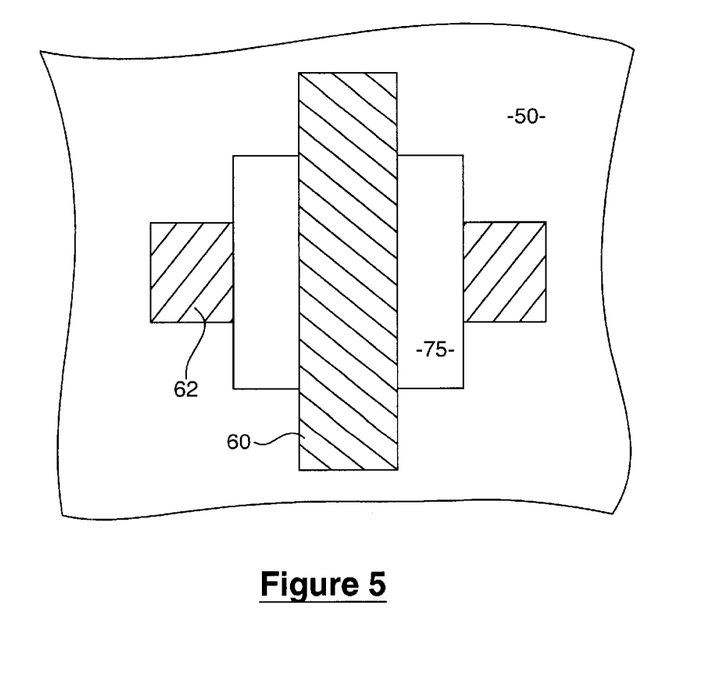
FIG. 5 is a simplified plan view of a cross-point array memory unit cell.

The memory array is sometimes herein referred to as a cross-point array memory in view of the structure thereof, and FIG. 5 provides a simplified plan view of a unit cell of the memory array of the preferred embodiment. The basic structure of the cross-point array memory comprises two layers of orthogonal sets of spaced parallel conductors arranged with a semiconductor layer therebetween. The two set of conductors form row and column electrodes overlaid in such a manner that each of the row electrodes intersects each of the column electrodes at exactly one place. At each of these intersections a connection is made between the row electrode (62 in FIG. 5) and column electrode (60 in FIG. 5) through the semiconductor layer (75 in FIG. 5) which acts in the manner of a diode and a fuse in series. The diodes in the array are all oriented so that if a common potential is applied between all the row electrodes and all the column electrodes then all the diodes will be biased in the same direction. The fuse element may be realized as a separate element which will open circuit when a critical current is passed therethrough or it may be incorporated in the behavior of the diode.

Although commonly in this description the semiconductor layer (e.g. 75) is referred to in the singular, in practice a plurality of layers of different materials may be employed. The layers may include materials that are not semiconductors, such as metals and even dielectrics in various configurations. The materials and structures suitable for implementing the desired functions are described in detail elsewhere.

Figure 6:
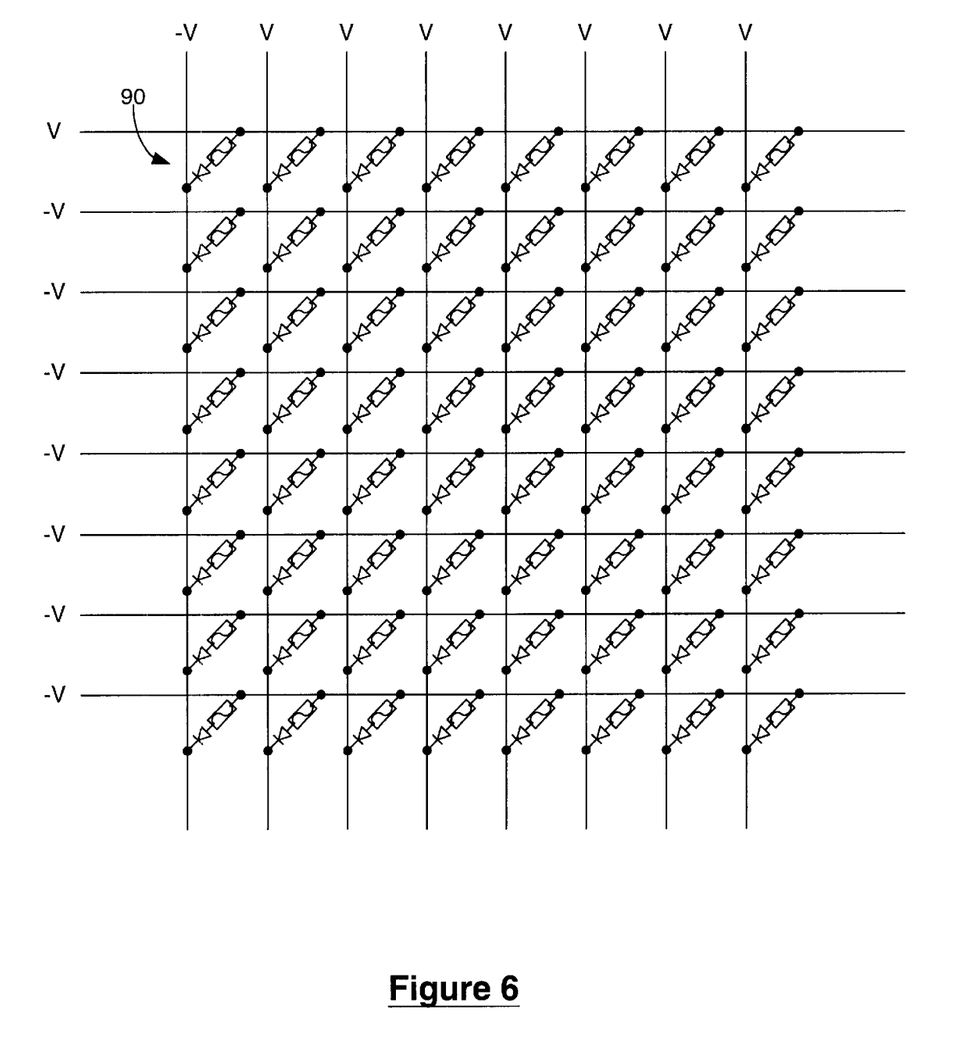
FIG. 6 shows a write-once memory array for illustration of addressing memory elements thereof.

FIG. 6 is a schematic representation of a cross-point write-once diode memory array. The figure shows an eight row by eight column array. If voltages are applied to the row and column electrodes as depicted (i.e. all the column electrodes are a potential V except for one which is at −V, and all the row electrodes are at −V except for one which is at V), then only one diode will be forward biased. For the case depicted in FIG. 6 only the diode (90) in the upper left corner of the array will be forward biased. The diodes in the top row and left-most column will have no bias on them and the remaining diodes in the array will be reverse biased. This constitutes an addressing scheme for the array. If a current flows between the rows and columns with the electrodes at these potentials then the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage causes a current that exceeds the threshold current of the fuse then the fuse can be blown, changing the state of the memory element. This constitutes a method for writing to the memory.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Memory Array Addressing Circuitry

In order to simplify interconnections to the memory module it is desirable to use a multiplexed addressing scheme for accessing the memory elements. In other words, it is desirable that each memory element in a memory array be uniquely addressable from an external circuit through addressing lines that are fewer in number than the total of the array row and column lines. To that end, addressing circuitry (30) is included on the same substrate as the memory array.

The addressing circuitry of the preferred embodiment is sometimes referred to herein as performing a multiplexing function. In the context of this specification the term "multiplexing" is understood to encompass the form of permuted diode logic addressing utilized in the preferred embodiment, even though the selection scheme is somewhat different from traditional multiplexing arrangements.

Figure 7:
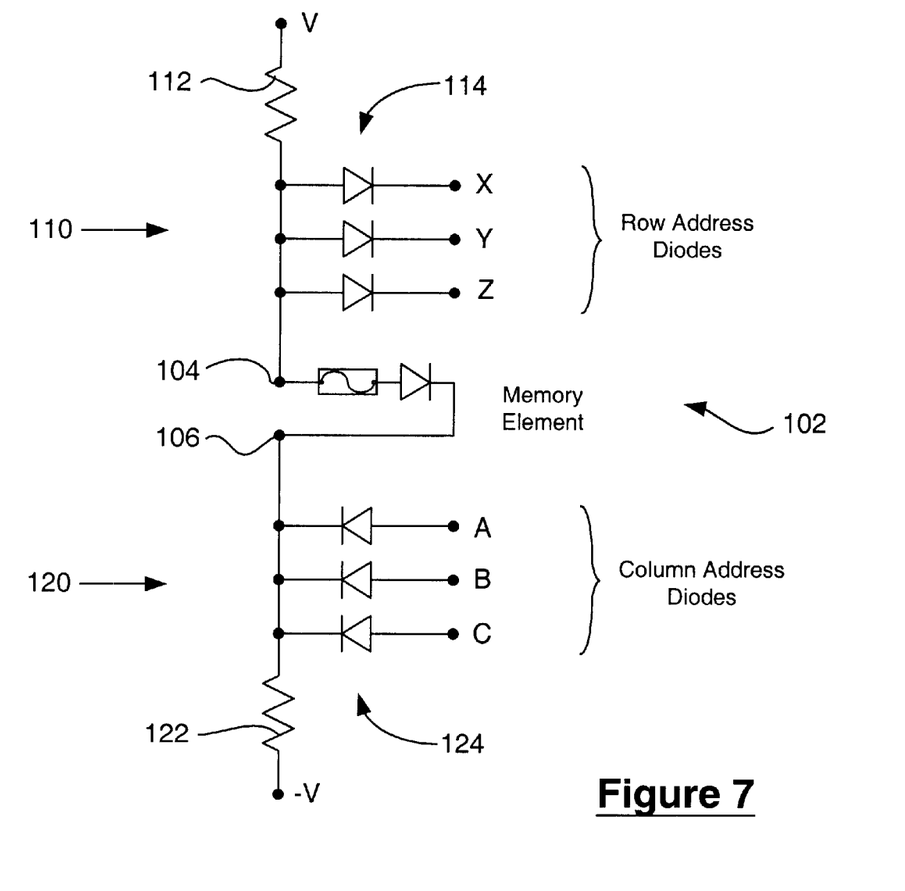
FIG. 7 is a schematic circuit diagram of a portion of a memory array addressing circuit.

In the preferred embodiment, the address multiplexing functions are carried out using a logic scheme referred to as permuted diode logic, which is described hereinbelow. FIG. 7 illustrates a single write-once memory element 102 represented by a fuse and diode in series. The memory element 102 is coupled between a row electrode 104 and a column electrode 106. A row address diode logic circuit 110 is coupled to the row electrode 104, and a column address diode logic circuit 120 is coupled to the column electrode 106. The row address circuit 110 as shown comprises a resistive element 112 coupled between the row electrode and a pull-up voltage +V. The row address circuit 110 also comprises plurality of row address diodes 114 having anodes coupled to the row electrode and cathodes controlled by respective row address input voltages represented by X, Y and Z. A column address diode logic circuit 120 is similarly constructed with a resistive element 122 coupled from the column electrode 106 to a pull-down voltage −V. A plurality of column address diodes 124 have their cathodes coupled to the column electrode, and anodes controlled by respective column address input voltages represented by A, B and C.

Consider firstly the row address circuit 110 in which logic levels of +V and −(V+ΔV) are used for the row address input voltages (X, Y, Z). It will be apparent that, where voltage +V represents a logic "1", the row address circuit 110 acts like an AND gate with the diode cathodes (X, Y, Z) as inputs and the row electrode 104 as output. The row electrode 104 is high (+V) only if all three row address inputs (X, Y, Z) are high. Similarly, the column address circuit 120 acts like a negative logic AND gate (e.g. a NAND gate). In this case, if logic levels of −V and (V+ΔV) are applied at the column address inputs (A, B, C), the output at the column electrode 106 will only be −V when all three inputs are at −V. If the row address inputs (X, Y, Z) all apply cathode voltages of +V to the diodes 114 and the column address inputs (A, B, C) all apply anode voltages of −V to the diodes 124 then the memory element 102 is selected. Although in FIG. 7 only three-input circuits are illustrated, this addressing scheme can be extended to include an arbitrary number of inputs.

There are $n^d$ permutations when one item is selected from each of d groups of n nodes. Therefore, $n^d$ electrodes can be connected through diodes to one out of n nodes in each of d groups. If a high logic level is applied to exactly one node in each group then only one electrode will be selected, since all lines connected to an electrode must be high to select it and no two electrodes share the identical connections.

Figure 8:
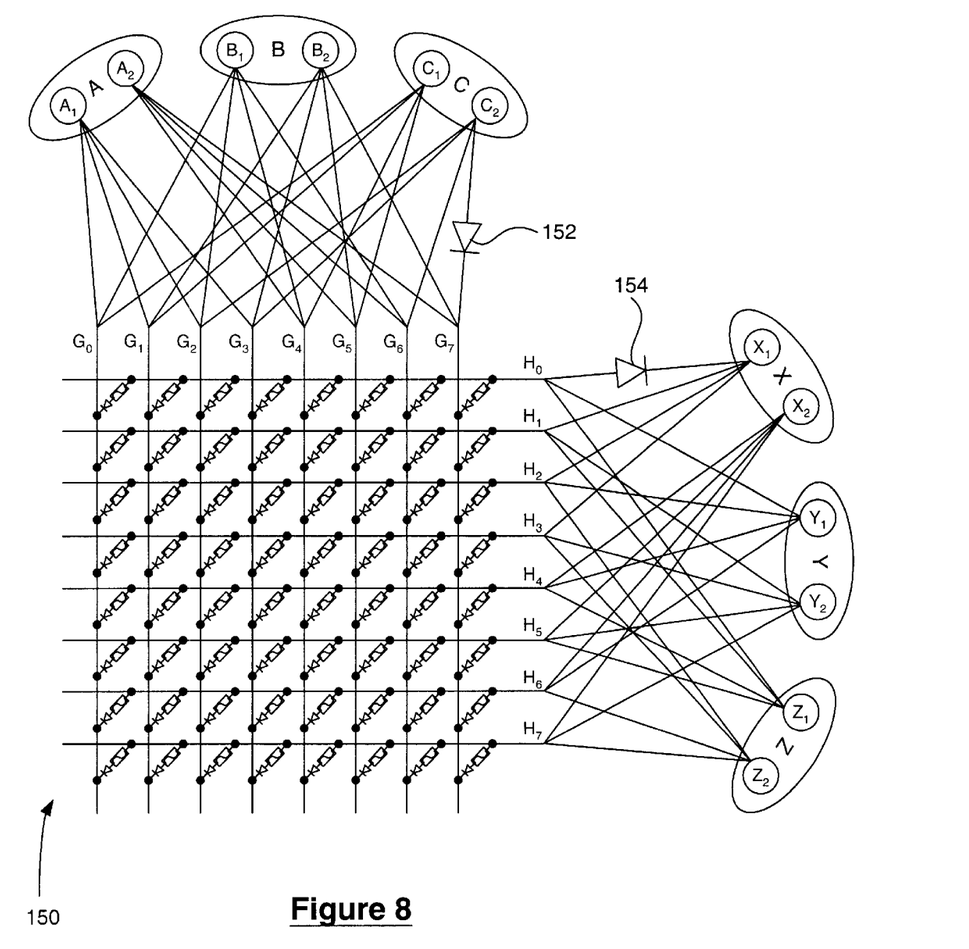
FIG. 8 shows a cross-point memory array with permuted diode logic addressing circuit connections illustrated schematically.

FIG. 8 schematically illustrates an 8×8 write-once memory array 150 having row and column electrodes coupled for addressing memory elements as described above. For reference, the column electrodes of the memory array 150 are labeled $G_0$ to $G_7$, and the row electrodes are labeled $H_0$ to $H_7$. Three addressing groups are provided each of the rows (X, Y, Z) and columns (A, B, C). Each of the addressing groups has two complementary addressing nodes (e.g. $A_1$ and $A_2$), and each node is coupled to four of the eight corresponding row/column electrodes. The connection pattern between the nodes and row/column electrodes is different for each addressing group. In the example of FIG. 8, the connection pattern is as follows:

| $A_1$ | $A_2$ | $B_1$ | $B_2$ | $C_1$ | $C_2$ |
|---|---|---|---|---|---|
| Column Electrode Address Node Connections | | | | | |
| $G_0$ | $G_4$ | $G_0$ | $G_1$ | $G_0$ | $G_2$ |
| $G_1$ | $G_5$ | $G_2$ | $G_3$ | $G_1$ | $G_3$ |
| $G_2$ | $G_6$ | $G_4$ | $G_5$ | $G_4$ | $G_6$ |
| $G_3$ | $G_7$ | $G_6$ | $G_7$ | $G_5$ | $G_7$ |
| $X_1$ | $X_2$ | $Y_1$ | $Y_2$ | $Z_1$ | $Z_2$ |
| Row Electrode Address Node Connections | | | | | |
| $H_0$ | $H_4$ | $H_0$ | $H_1$ | $H_0$ | $H_2$ |
| $H_1$ | $H_5$ | $H_2$ | $H_3$ | $H_1$ | $H_3$ |

-continued

| $H_2$ | $H_6$ | $H_4$ | $H_5$ | $H_4$ | $H_6$ |
| $H_3$ | $H_7$ | $H_6$ | $H_7$ | $H_5$ | $H_7$ |

The connections between the column electrodes and column addressing nodes each include a diode coupled as shown at 152, and the connections from row electrodes to row addressing nodes each include a diode coupled as shown at 154. Most of these diodes are not shown in the FIG. 8 diagram so as to avoid unnecessary complication. Although the topology in this example shows the address lines all connected to one end of the electrodes in the array, the address lines may just as easily be connected to either or both ends of the electrode (sides of the array).

The memory array 150 is addressed by applying voltages at the addressing nodes ($A_1$, $A_2$, etc.). An enabling voltage is applied at only one node from each addressing group. This allows a single memory element from the array 150 to be selected, in the manner described above in relation to FIG. 7.

A cross-point array of N memory elements requires $2\sqrt{N}$ row and column electrodes. These electrodes can be addressed by $2d^{2d}\sqrt{N}$ address lines where d is the order of the network. For example $10^8$ memory elements will require a total of 20000 row and column electrodes, but can be addressed by 400 lines with a second order network (2 groups of 100 nodes for the rows and the same for the columns) or 80 lines for a fourth order network (4 groups of 10 nodes for the rows and the same for the columns). In general, for a high order network the number of lines approaches 2d, although this does not determine the minimum number of addressing lines required for a given array. It can be shown that the order corresponding to the minimum number of address lines required for an array of given size, N, is $\ln(N^{0.5})$. Accordingly, for the example presented above, the minimum number of address lines is achieved at (approximately) a ninth order system, and is equal to about 50.

Figure 9:
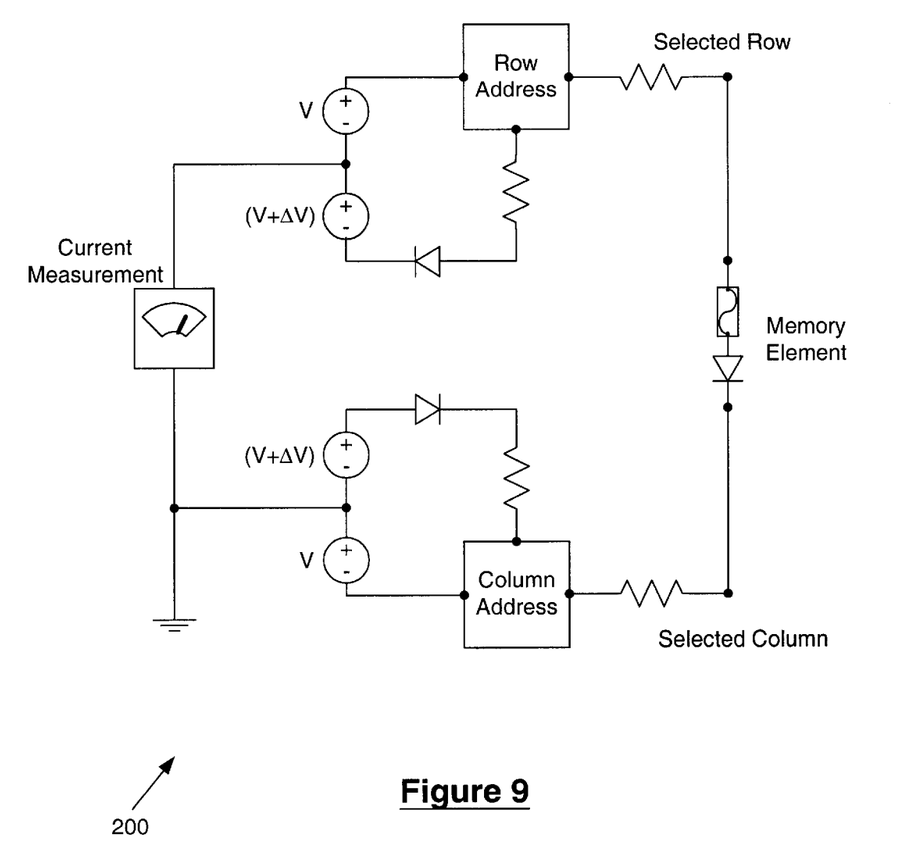
FIG. 9 is a schematic circuit diagram of a memory element sensing circuit.

FIG. 9 is a schematic block diagram of a circuit that can be used for detecting the state of a selected memory element. The diode logic used to select a memory element as described above requires currents to flow through diodes coupled to unselected address lines, however these currents are localized to either the row electrodes or the column electrodes. The only currents which flow from the row electrodes to the column electrodes are the current through the selected memory element and any leakage current from the unbiased or reverse biased diodes of the array. In the absence of any leakage currents the detection of the state of a memory element simply involves isolating the power supplies for the row and column electrodes through a shunt which carries a current equal to that passing through the memory element. Such a circuit 200 is illustrated in FIG. 9.

A difficulty that may be encountered with this sensing scheme is that the presence of even a small leakage current in a large array of diodes can swamp the current from a single forward biased diode, making explicit sensing of the diode forward bias current difficult. One possible solution to this problem is to deselect all the memory elements and make a first current measurement (which comprises the leakage current only), then select a memory element and make a second current measurement. The difference between the first and second current measurements then represents the current through the selected memory element (e.g. nothing for a data "1" or the diode forward bias current for a data "0").

Figure 10:
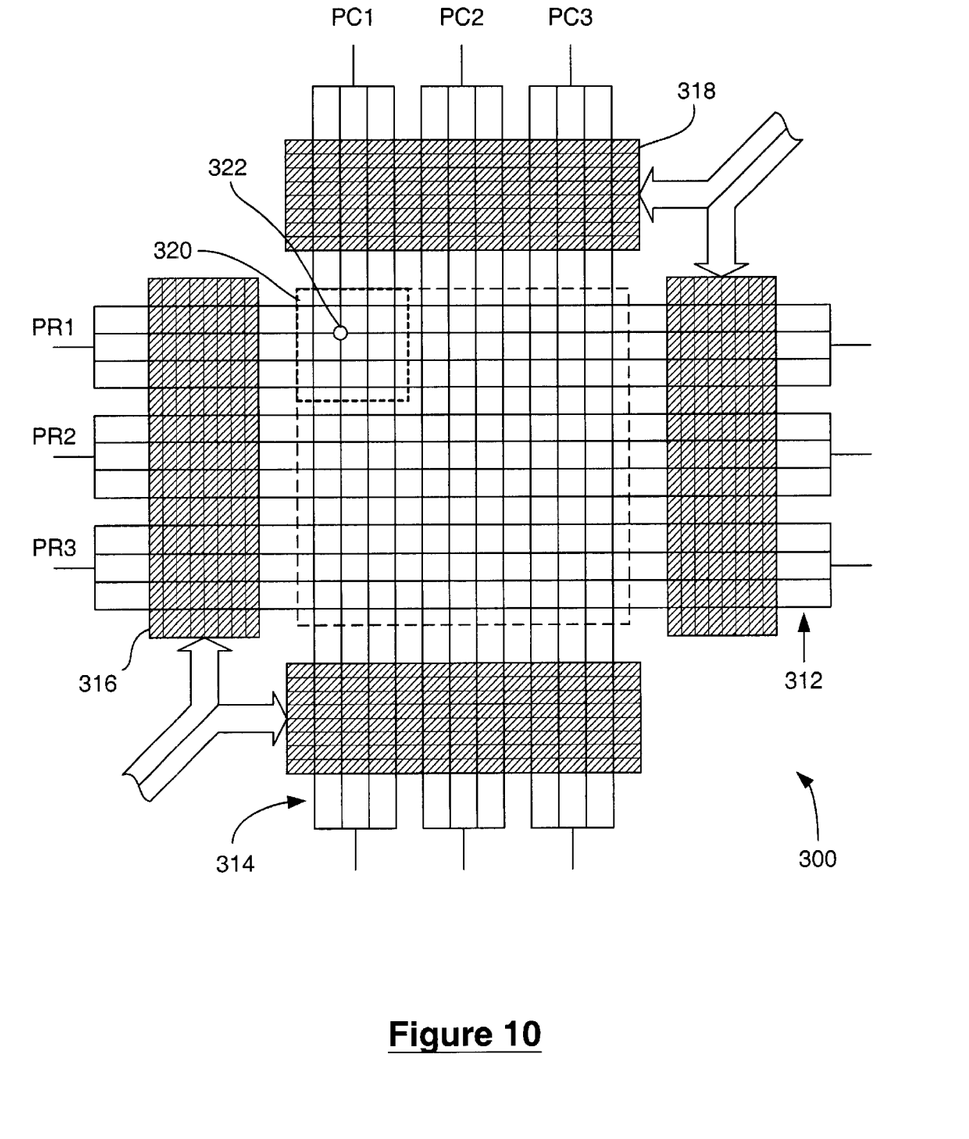
FIG. 10 is a schematic layout diagram of a memory circuit according to an embodiment of the invention.

The memory circuit 300 in FIG. 10 has a cross-point memory array 310 formed by a matrix of row (312) and column (314) electrodes. The row and column electrodes extend from the memory array through addressing (mux/demux) circuitry 316, 318 of the variety described above. Since the addressing circuitry is primarily constructed from diode interconnections between the addressing lines and memory array electrodes, the addressing circuitry can be formed in the same process as the memory array. Indeed, the diode interconnections between the address lines and electrodes are preferably formed by providing address lines that extend across the respective electrode lines, separated by the semiconductor layer as in the memory array. This forms a diode connection between an address lines and each array electrode that it crosses. The selective diode connections between address lines and electrodes necessary to implement the addressing scheme as described in connection with FIGS. 7 and 8, for example, can then be formed by "blowing" selected address line to electrode diode connections in a manner similar to that used for storing data in the array.

At the time of fabrication, diode junctions are formed between each of the column address lines and each of the column electrodes, and between each of the row address lines and each of the row electrodes. However, in order to implement the group/node addressing scheme described above, it is necessary that only selected diode connections be maintained between addressing lines and array electrodes. The "programming" of the selected connections can be finalized after the circuit fabrication by blowing certain address diodes leaving only the selected diode connections intact. This is achieved by fabricating the address lines, for example, with a modulated line width so as to selectively vary the cross-sectional area of diode junctions to the array electrodes. As discussed above, the cross-sectional area of a given diode element can be adjusted to change the applied voltage/current that is necessary to reach the critical current density to blow that diode. Thus, the address line width is modulated so as to be narrower at certain cross-points with the array electrodes so that the diodes thereat have reduced cross-sectional areas. Then, when a programming voltage is applied to the circuits only those diodes with reduced area can be caused to blow, leaving the desired diode connections intact.

Referring again to FIG. 10, leakage currents in the array during sensing can be minimized by arranging the power connections to the ends of the row and column electrodes in groups or stripes. Using this scheme, power can be applied to the array such that only the region of the array where the addressed memory element resides is energized, the remaining electrodes being coupled to a high impedance state. As shown in the Figure, the column electrode ends are coupled into power supply stripes having power supply inputs PC1, PC2 and PC3, and the row electrodes are coupled to respective power supply stripe inputs PR1, PR2 and PR3. In this example, if the memory element indicated at 322 is to be addressed, power can be applied through power supply stripe inputs PC1 and PR1, which energizes only the sub-array 320 containing the memory element 322. Then, during the read or write operation of memory element 322, leakage currents can only occur in a small fraction of the memory array through the elements in the sub-array 320. The power supply striping can be used as part of the addressing scheme to maintain interconnect efficiency.

Integrated Circuit Structure

The memory circuit of the preferred embodiment comprises a memory array and addressing circuitry can be formed, for example, according to a metal-semiconductormetal (MSM) process on the plastic substrate 50. The MSM process results in two patterned layers of conductive metal circuits with one or more layers of semiconductor material therebetween. Where the metal layers cross and make contact to opposed sides of the semiconductor layer, a diode junction is formed between the metal layers. The production of MSM diode integrated circuits is described, for example, in the specification of International Patent Application Publication Number WO 99/39394, entitled "X-Y Addressable Electric Microswitch Arrays and Sensor Matrices Employing Them". The disclosure of that document is explicitly incorporated herein by reference. Further details of memory circuit fabrication and construction of a memory module of the kind described hereinabove may be found in the specification of the aforementioned co-pending US patent application.

General Considerations

The memory system described herein has several features that make it particularly suitable for portable data storage applications such as in digital cameras (still picture and/or video), digital music players/recorders (e.g. MP3 players), personal digital assistants (PDAs), mobile telephones, etc. The memory system is able to provide data storage in capacities sufficient to be useful such appliances and can be produced at relatively low cost. Data can be written to the memory and thereafter it is permanently stored. Thus, a high capacity storage device (e.g. 100 MB to over 1 GB) can be provided at low cost (e.g. less than about $5) for permanent archival data storage with use in portable appliances.

The data storage is provided by a memory module that is produced at low cost by using inexpensive materials and processing technology. The memory module may be formed from a plurality of layers each having a cross-point memory array and addressing circuitry. Each layer can be formed on an inexpensive flexible substrate, such as polymer or dielectric coated metal film, which is much cheaper than a traditional single crystal silicon substrate and allows for relatively fast and inexpensive fabrication processes to be used. The circuitry formed on each layer, comprising the cross-point memory array and associated addressing circuits, is designed to be simple in structure to enable uncomplicated fabrication processing. In particular, the memory array and addressing circuits are designed according to a permuted diode logic regime which allows both the memory array and addressing circuits to be fabricated using the same simple process.

Each memory module layer has two sets of electrode conductors arranged in respective layers with a semiconductor layer therebetween. The electrodes are arranged in an orthogonal matrix and at the intersection point of each pair of crossing electrodes a memory element is formed in the semiconductor material. The semiconductor layer allows for low temperature processing so as to be compatible with a plastic substrate, and may be an amorphous silicon material or constructed from one or more organic semiconductor materials. Where the electrode layers cross, separated by the semiconductor layer, a rectifying junction is formed between the two electrode conductors. Each rectifying junction can be considered as a diode in series with a fuse element, and such junctions form the basis of the memory array and the diode logic addressing circuits.

The addressing circuitry included on a memory module layer facilitates a reduction in the number of externally accessible addressing lines that are required to read from or write to the memory elements in an array. This facilitates, for example, a manageable number of the interconnections from a layer in the memory module to external circuitry reading and writing, and the like. For example, using the permuted diode logic addressing scheme described a memory array of 100,000,000 bits can be addressed by 50 external addressing lines. Power supply striping can also be used, wherein power is supplied to only a portion of the memory array at a time, which reduces leakage currents in the array and can also form part of the memory array addressing scheme.

Interface and control circuitry is separate from the memory module, constructed for example in the form of a convention integrated circuit or circuits. The interface and control circuitry includes a circuit for generating addressing signals to be applied to the memory module, and a sensing circuit for reading stored data. The sensing scheme is based on electrical current levels rather than electric charge, which allows the sensing circuitry to more easily read data remotely from the memory module. Furthermore, the data storage is based on a large resistance change when a memory element fuse is blown, which provides relatively large sensing signals.

The foregoing detailed description of a preferred embodiment of the present invention is presented by way of example only, and many variations to the circuits, structures, arrangements and processes described are possible without departing from the scope of the invention. For example, the memory addressing system of the preferred embodiment is described primarily in the context of a memory module having a plurality of layers of memory circuits, however it will be readily recognized that many other applications are possible.

The structure of the memory module also has many possible variations whilst retaining the principles of the present invention. In the described embodiment a single memory array is fabricated on each layer, and the layers are aligned and stacked in top of one another. Each layer could alternatively include more than one memory array, and the layers could also be stacked in a different way, such as a fan-fold stack. It may also be advantageous in some applications to fabricate multiple circuit layers built up on a single substrate.

The principles of the present invention can be applied with many other variations to the circuits, structures, arrangements and processes described herein, as will be apparent to those of ordinary skill in the art, without departing from the scope of the invention as defined in the appended claims.

We claim:

1. An addressing circuit for addressing a cross-point memory array having first and second sets of electrodes arranged so that each electrode in the first set crosses over each electrode in the second set and a respective memory element is formed at each crossing point of the electrodes from the first and second sets, the addressing circuit comprising:

a first set of address lines and a plurality of first diode elements coupled between the first set address lines and the first set electrodes, wherein each of said first set electrodes are coupled by said first diode elements to a respective unique subset of the first set address lines; and a second set of address lines and a plurality of second diode elements coupled between the second set address lines and the second set electrodes, wherein each of said second set electrodes are coupled by said second diode elements to a respective unique subset of the second set address lines.

2. An addressing circuit as claimed in claim 1, including an address application circuit coupled to said address lines, the application circuit for applying predetermined voltages to selected subsets of said first and second set address lines, and a sensing circuit coupled to said first and second set address lines for sensing an electrical current in said address lines resulting from said applied voltages to thereby determine a binary state of an addressed memory element in said array based on the sensed electrical current.

3. An addressing circuit as claimed in claim 2, including a memory writing circuit coupled to said first and second sets of address lines and said first and second set electrodes, the memory writing circuit for applying predetermined write voltages to said first and second sets of electrodes and a selection voltage to selected subsets of said first and second set address lines, the predetermined write voltage being sufficient to effect a permanent and substantial change in resistance of an addressed memory element in said array determined by said selected subsets.

4. An addressing circuit as claimed in claim 3, wherein the first diode elements are oriented differently from the second diode elements with respect to the memory array electrodes and address lines.

5. An addressing circuit as claimed in claim 4, wherein the first diode elements have anodes coupled to the respective first set memory array electrodes and cathodes coupled to the respective first set address lines, and the second diode elements have cathodes coupled to the respective second set memory array electrodes and anodes coupled to the respective second set address lines.

6. An addressing circuit as claimed in claim 5, wherein the cross-point memory array comprises an array of diode based memory elements formed at cross-points of electrodes from said first and second sets, with ends of the electrodes coupled to power supply connections through respective resistive elements.

7. An addressing circuit as claimed in claim 6, wherein the power supply connections are arranged in power supply striping groups to enable power to be selectively supplied to portions of the cross-point array.

8. An integrated circuit including a cross-point diode memory array and an addressing circuit as claimed in claim 1.

9. An integrated circuit as claimed in claim 8, wherein the cross-point diode memory array and addressing circuit are formed in the same fabrication process.

10. A memory circuit comprising:
a cross-point memory array having first and second sets of transverse electrodes with respective memory elements formed at the crossing-points of the first and second set electrodes, each memory element including, in at least one of its binary states, a diode element;
an addressing circuit comprising:
a first set of address lines with first diode connections between said first set address lines and said first set memory array electrodes, said first diode connections coupling each memory array electrode in the first set to a respective unique subset of the first set address lines;
a second set of address lines with second diode connections between said second set address lines and said second set memory array electrodes, said second diode connections coupling each memory array electrode in the second set to a respective unique subset of the second set address lines; and
a read/write circuit coupled to the address lines, the read/write circuit for applying predetermined voltages to selected subsets of said first and second set address lines, and including a sensing circuit coupled to said first and second set address lines for sensing an electrical current in said address lines resulting from said applied voltages to thereby determine a binary state of an addressed memory element in said array based on the sensed electrical current.

11. A memory circuit as claimed in claim 10, wherein the read/write circuit further includes a memory writing circuit coupled to said first and second sets of address lines and said first and second set electrodes, the memory writing circuit for applying predetermined write voltages to said first and second sets of electrodes and a selection voltage to selected subsets of said first and second set address lines, the predetermined write voltage being sufficient to effect a permanent and substantial change in resistance of an addressed memory element in said array determined by said selected subsets.

12. A memory circuit as claimed in claim 11, wherein the diode elements of the first diode connections are oriented differently from the diode elements of the second diode connections with respect to the memory array electrodes and address lines.

13. A memory circuit as claimed in claim 11, wherein ends of the memory array electrodes are coupled to power supply connections through respective resistive elements, with the power supply connections being arranged in power supply striping groups to enable power to be selectively supplied to portions of the cross-point array.

14. A memory circuit as claimed in claim 11, wherein the first diode connections are formed at crossing-points of the first address lines and the first memory array electrodes, and the second diode connections are formed at crossing-points of the second address lines and the second memory array electrodes.

15. An integrated circuit having at least one memory circuit as claimed in claim 11.

16. An integrated circuit as claimed in claim 15, wherein the memory array and addressing circuit are formed in a fabrication process, wherein the fabrication process for forming the memory array and addressing circuit is the same.

17. An integrated circuit as claimed in claim 15, formed on a dielectric substrate surface.

18. A method for reading data from a cross-point memory array having first and second sets of electrodes from first and second sets of address lines, comprising:
forming first diode connections between said first set address lines and said first set memory array electrodes, said first diode connections coupling each memory array electrode in the first set to a respective unique subset of the first set address lines;
forming second diode connections between said second set address lines and said second set memory array electrodes, said second diode connections coupling each memory array electrode in the second set to a respective unique subset of the second set address lines; and
applying predetermined voltages to selected subsets of said first and second set address lines, and sensing an electrical current in said address lines resulting from said applied voltages to thereby determine a binary state of an addressed memory element in said array based on the sensed electrical current.

19. A method for writing data to a cross-point memory array having first and second sets of electrodes from first and second sets of address lines, comprising:
forming first diode connections between said first set address lines and said first set memory array electrodes, said first diode connections coupling each memory array electrode in the first set to a respective unique subset of the first set address lines;
forming second diode connections between said second set address lines and said second set memory array electrodes, said second diode connections coupling each memory array electrode in the second set to a respective unique subset of the second set address lines; and applying predetermined write voltages to said first and second sets of electrodes and a selection voltage to selected subsets of said first and second set address lines, the predetermined write voltage being sufficient to effect a permanent and substantial change in resistance of an addressed memory element in said array determined by said selected subsets.

* * * * *